(12) United States Patent
Park

(10) Patent No.: US 9,831,426 B2
(45) Date of Patent: Nov. 28, 2017

(54) CBRAM DEVICE AND MANUFACTURING METHOD THEREOF

(71) Applicant: IUCF-HYU, Seoul (KR)

(72) Inventor: Jea Gun Park, Seongnam-Si (KR)

(73) Assignee: IUCF-HYU (KR)

(*) Notice: Subject to any disclaimer, the term of this patent is extended or adjusted under 35 U.S.C. 154(b) by 0 days.

(21) Appl. No.: 14/710,546

(22) Filed: May 12, 2015

(65) Prior Publication Data

US 2016/0336510 A1 Nov. 17, 2016

(51) Int. Cl.
*H01L 45/00* (2006.01)

(52) U.S. Cl.
CPC ........ *H01L 45/085* (2013.01); *H01L 45/1233* (2013.01); *H01L 45/1266* (2013.01); *H01L 45/146* (2013.01); *H01L 45/1625* (2013.01); *H01L 45/1641* (2013.01)

(58) Field of Classification Search
CPC ................................. H01L 45/45; H01L 45/46
USPC ............................................................. 257/4
See application file for complete search history.

(56) References Cited

U.S. PATENT DOCUMENTS

2013/0056700 A1* 3/2013 Wang ...................... H01L 45/08
257/4
2013/0294145 A1 11/2013 Sandhu
2014/0169062 A1* 6/2014 Lee ...................... G11C 13/0002
365/148
2014/0264248 A1* 9/2014 Sato ...................... H01L 45/085
257/4

FOREIGN PATENT DOCUMENTS

| KR | 100843676 B1 | 7/2008 |
| KR | 20110092092 A | 8/2011 |
| WO | 2012158719 A1 | 11/2012 |

OTHER PUBLICATIONS

Jo, Sung Hyun, et al., "High-Density Crossbar Arrays Based on a Si Memristive System", Nano Letters, 2009 American Chemical Society, vol. 9, No. 2, received Dec. 13, 2008, published on web Jan. 21, 2009, pp. 870-874.

* cited by examiner

*Primary Examiner* — Marc Armand
*Assistant Examiner* — Warren H Kilpatrick
(74) *Attorney, Agent, or Firm* — Renaissance IP Law Group LLP

(57) ABSTRACT

Provided are a conductive bridging random access memory (CBRAM) device and a manufacturing method thereof. The CBRAM device includes a first electrode, a semiconductor oxide electrolyte layer formed on the first electrode and including a plurality of metal vacancies, a second electrode formed on the semiconductor oxide electrolyte layer, wherein when a positive voltage is applied to the second electrode, cations are reduced to the metal vacancies in the semiconductor oxide electrolyte layer to form a metal bridge.

15 Claims, 26 Drawing Sheets

CBRAM DEVICE AND MANUFACTURING METHOD THEREOF

BACKGROUND

The present disclosure relates to a memory device and a manufacturing method thereof, and more particularly, to a conductive bridging random access memory (CBRAM) device showing a nonvolatile memory behavior by forming a metal bridge and a manufacturing method thereof.

A resistive random access memory (ReRAM) is one of next generation memories being developed for overcoming limitations of DRAMs and flash memories, and gets the spotlight with a simple structure including an oxide film intervened between top and bottom electrodes. A ReRAM implements nonvolatile memory characteristics by adjusting oxygen vacancies in an oxide film prepared between top and bottom electrodes. However, due to low conductivity and difficulty in adjustment of oxygen vacancies, the ReRAM has low current density and low reliability.

In order to complement such a weak point of the ReRAM, a conductive bridging random access memory (CBRAM) is being researched. A CBRAM has a structure in which a solid electrolyte layer is formed between the top and bottom electrodes, and may have a high current density by forming a metal bridge inside the solid electrolyte layer. Such a CBRAM is a device showing a bidirectional switching behavior, which maintains a low resistance state by allowing metal cations to be drifted into the solid electrolyte layer to form a metal bridge according to application of a positive voltage to the top electrode, and maintains a high resistance state by allowing a part of the metal bridge to be cut according to application of a negative voltage.

As a solid electrolyte material, amorphous silicon, copper doped zinc oxide (Cu-doped $ZrO_2$), copper doped silicon oxide (Cu-doped $SiO_2$), Ag—Ge—Se, Ag—Ge—S, $Cu_2S$, $Ta_2O5$, and a polymer, etc., are used. For example, NANO LETTERS 2009, Vol. 9, No. 2 pp. 870~874 discloses using amorphous silicon as a solid electrolyte material.

SUMMARY

The present disclosure provides a CBRAM device and a manufacturing method thereof capable of increasing a current density and improving data retention and endurance characteristics.

The present invention also provides a CDRAM device and a manufacturing method thereof capable of increasing a current density by forming a semiconductor oxide electrolyte layer having a plurality of metal vacancies between first and second electrodes and adjusting the metal vacancies.

In accordance with an exemplary embodiment, a conductive bridging random access memory (CBRAM) device includes: a first electrode; a semiconductor oxide electrolyte layer configured to be formed on the first electrode and include a plurality of metal vacancies: and a second electrode configured to be formed on the semiconductor oxide electrolyte layer.

The first electrode may be formed of a material of which cations are not moved to the semiconductor oxide electrolyte layer even when a positive voltage is applied to the first electrode, and the second electrode may be formed of a material of which cations are moved to the semiconductor oxide electrolyte layer when the positive voltage is applied to the second electrode.

Cations may be reduced to the metal vacancies of the semiconductor oxide electrolyte layer to form a metal bridge when the positive voltage is applied to the second electrode.

The semiconductor oxide electrolyte layer may be formed of at least any one of $Cu_xO$ ($1 \leq x \leq 2$), $NiO_x$, $TiO_x$, $Sn_xO$, $Co_xOy$, $Zn_xO$, $Al_xO_y$, and IGZO.

$Cu_xO$ ($1 \leq x \leq 2$) may include any one of CuO and $Cu_2O$.

At least one of an amount and size of the metal vacancies may be adjusted by adjusting a ratio of any one selected from among CuO, $Cu_2O$, $NiO_x$, $TiO_x$, $Sn_xO$, $Co_xOy$, $Zn_xO$, $Al_xO_y$, and IGZO with respect to at least any one of rest except for the selected one.

The semiconductor oxide electrolyte layer may be formed to include a thickness of approximately 10 nm to approximately 45 nm.

CuO may be formed to include a thickness of approximately 10 nm to approximately 45 nm, and $Cu_2O$ may be formed to include a thickness of approximately 25 nm to approximately 40 nm.

A current density may be approximately 2 $MA/cm^2$ or greater, a set voltage may be approximately 0.2 V to approximately 2 V, and a reset voltage may be approximately −0.5 V to approximately 2 V.

In accordance with another exemplary embodiment, a manufacturing method of a conductive bridging random access memory (CBRAM) device includes forming a first electrode on a substrate; forming a semiconductor oxide electrolyte layer including a plurality of metal vacancies on the first electrode; heat-treating the semiconductor oxide electrolyte layer; and forming a second electrode on the semiconductor oxide electrolyte layer.

The semiconductor oxide electrolyte layer may be formed of at least any one of $Cu_xO$ ($1 \leq x \leq 2$), $NiO_x$, $TiO_x$, $Sn_xO$, $Co_xOy$, $Zn_xO$, $Al_xO_y$, and IGZO.

At least one of an amount and size of the metal vacancies may be adjusted by adjusting a ratio of any one selected from among CuO, $Cu_2O$, $NiO_x$, $TiO_x$, $Sn_xO$, $Co_xOy$, $Zn_xO$, $Al_xO_y$, and IGZO with respect to at least any one of rest except for the selected one.

At least any one of an amount and size of the metal vacancies may be adjusted by adjusting a thickness, formation condition, and heat treatment condition of the semiconductor oxide electrolyte layer.

CuO and $Cu_2O$ may be respectively formed in a sputter scheme using CuO and $Cu_2O$ targets.

CuO may be formed by supplying oxygen and an inert gas.

The oxygen may be supplied at a concentration of approximately 5% to approximately 10% in comparison to the inert gas.

The heat treatment may be performed at a temperature of a room temperature to approximately 550° C. in an inert atmosphere.

CuO may be heat-treated at a temperature of approximately 350° C. to approximately 550° C., and $Cu_2O$ may be heat-treated at a temperature of a room temperature to approximately 265° C.

$Cu_2O$ may be formed and then heat-treated at a temperature of approximately 270° C. to approximately 550° C. to be converted into CuO.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
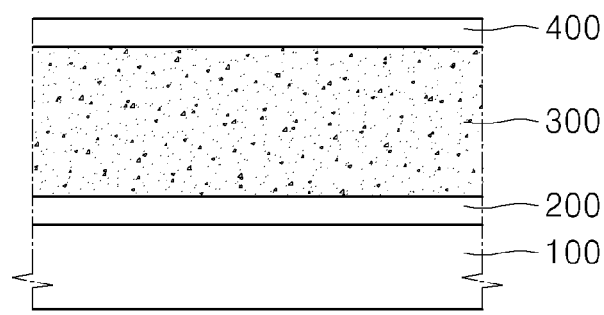
FIG. 1 is a cross-sectional view of a memory device in accordance with an exemplary embodiment.

FIG. 1 is a cross-sectional view of a memory device in accordance with an exemplary embodiment.

Referring to FIG. 1, a memory device according to an exemplary embodiment may include a substrate 100, a first electrode 200 formed on the substrate 100, a semiconductor oxide electrolyte layer 300 formed on the first electrode 200, and a second electrode 400 formed on the semiconductor oxide electrolyte layer 300.

The substrate 100 may be a semiconductor substrate. For example, as the substrate 100, a silicon substrate, gallium arsenide substrate, silicon germanium substrate, or a silicon oxide substrate may be used, and a silicon substrate is used in the exemplary embodiment. In addition, an insulation film (not illustrated) may be further formed on the substrate 100 and a diffusion barrier (not illustrated) may be further formed on the insulation film. The insulation film is formed of an insulation material such as silicon oxide or silicon nitride in at least one layer and the diffusion barrier may be formed of TiN.

The first electrode 200 may be formed of a chemically inert conductive material. In other words, the first electrode 200 may be formed of a material that even though a positive voltage is applied to the first electrode 200, cations do not move to the semiconductor oxide electrolyte layer 300. The chemically inert conductive material may include at lease one selected from among platinum (Pt), ruthenium (Ru), titanium nitride (TiN), and a tantalum nitride (TaN). The first electrode 200 may be formed in a single layer or a stacked structure of two or more layers by using such a chemically inert conductive material. In present embodiment, platinum is used for the first electrode 200.

The semiconductor oxide electrolyte layer 300 has a plurality of vacancies therein and a bridge is formed by metal ions diffused from the second electrode 400. Such a semiconductor oxide electrolyte layer 300 may be formed of p-type semiconductor oxide and n-type semiconductor oxide. The p-type semiconductor oxide may include copper oxide of $Cu_xO$ (1≤x≤2) including at least any one of CuO and $Cu_2O$. In other words, the semiconductor oxide electrolyte layer 300 may be formed of CuO or $Cu_2O$. In addition, the p-type semiconductor oxide may include NiO, $Sn_xO$, or $Co_xO_y$, and the n-type semiconductor oxide may include $TiO_x$, $Zn_xO$, $Al_xO_y$, and indium gallium zinc oxide (IGZO). Accordingly, the semiconductor oxide electrolyte layer 300 may be formed by using at least any one of the p-type semiconductor oxide and n-type semiconductor oxide. In this way, the semiconductor oxide electrolyte layer 300 is formed between the first and second electrodes 200 and 400, so that cations may move from the second electrode 400 through the metal vacancies in the semiconductor oxide electrolyte layer 300, and a metal bridge may be formed in the semiconductor layer 300 with the cations reduced to the metal vacancies. Here, the reason why CuO and $Cu_2O$ are p-type semiconductor materials will be described as follows. The energy levels of CuO and $Cu_2O$ are split while 3d10 orbital of cations of copper (Cu) performs a covalent bond with anions of oxygen (O) in an oxidation process. The highest energy level among the split energy levels and 4s orbital of cations of the copper respectively become a valence band and conduction band and form a semiconductor energy band gap in-between. During forming a thin film, since negative charged copper vacancies are formed to create movable holes, an acceptor level is formed at 0.3 eV above the valence band so that CuO and $Cu_2O$ have p-type characteristics. Here, CuO has more metal vacancies than $Cu_2O$. Accordingly, a bridge may be formed thicker and in plurality in CuO than in $Cu_2O$. When the bridge is formed thick, a set voltage applied to the second electrode 400 is lowered to make the bridge in a low resistance state, but a high reset voltage is required to be applied for a high resistance state. In other words, even when a low voltage is applied, a bridge is formed and a low resistance state is achieved, but in order to cut the bridge and make a high resistance state, high voltage application is required. On the contrary, $Cu_2O$ has less metal vacancies than CuO and the bridge may be formed thinner. In this case, a high set voltage is applied for making a low resistance state, but a low reset voltage is applied for making a high resistance state. Furthermore, since the semiconductor oxide electrolyte layer 300 may be formed of at least two materials, for example, CuO and $Cu_2O$, mixed at a predetermined ratio, the amount and size of metal vacancies in the semiconductor oxide electrolyte layer 300 may be adjusted and accordingly characteristics such as a set/reset voltage and current density of a memory device may be adjusted. Here, in order to adjust a ratio of CuO and $Cu_2O$, an oxygen atmosphere for forming the semiconductor oxide electrolyte layer 300 may be adjusted and a heat treatment temperature after formation of the semiconductor oxide electrolyte layer 300 may be adjusted. Of course, the metal vacancies in CuO or $Cu_2O$ may be adjusted. For example, the metal vacancies may be adjusted by heat treatment after formation of the semiconductor oxide electrolyte layer 300. Accordingly, characteristics such as a set/reset voltage of a memory device may be adjusted by using CuO or $Cu_2O$ solely. In addition, the semiconductor oxide electrolyte layer 300 may be formed by adjusting, for example, a ratio of CuO, $Cu_2O$ and NiO, and to this end, a material ratio, oxygen atmosphere, and heat treatment temperature for forming the semiconductor layer 300 may be adjusted.

The second electrode 400 may include a conductive material in which metal ions are generated. In other words, when a positive voltage is applied to the second electrode 400, cations are generated to form a material moving to the semiconductor oxide electrolyte layer 300. The conductive material in which metal ions are generated may include copper (Cu) and silver (Ag). In the present embodiment, silver is used for the second electrode 400. When a positive voltage is applied to the second electrode 400, metal cations of the second electrode 400 move along the metal vacancies of the semiconductor oxide electrolyte layer 300 and are replaced with the metal vacancies, and accordingly a bridge is formed. Due to formation of the metal bridge, the memory device has a low resistance stage. In addition, when a negative voltage is applied to the second electrode 400, cations move again to the second electrode 400 and are reduced, and accordingly the metal bridge formed inside the semiconductor oxide electrolyte layer 300 is cut and the memory device becomes in a high resistance state.

Figure 2:
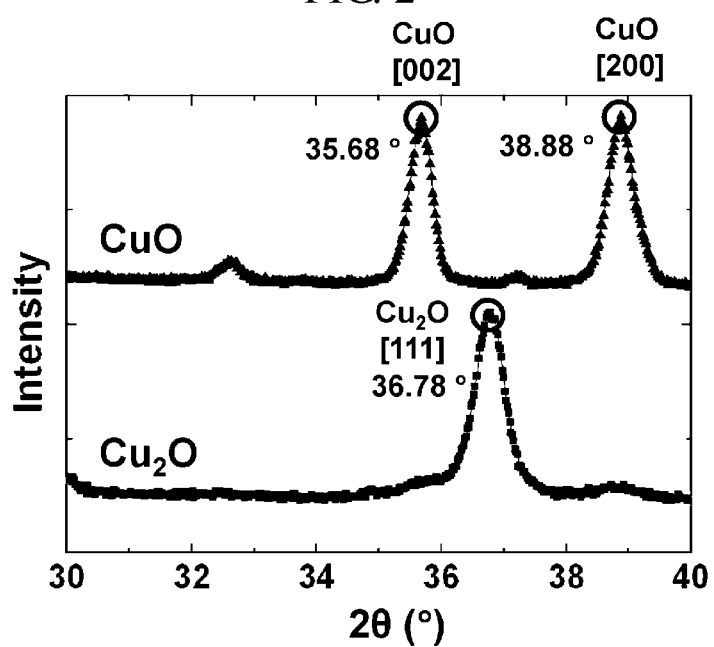
FIG. 2 is an XRD graph of CuO and $Cu_2O$ used as a semiconductor oxide electrolyte layer in accordance with an embodiment.

FIG. 2 is an XRD graph of CuO and $Cu_2O$ used as a semiconductor oxide electrolyte layer in accordance with an embodiment. As illustrated in FIG. 2, CuO is in a monoclinic structure and has 2θ values of approximately 35.68° and approximately 38.88° in [002] and [200] planes. In addition, $Cu_2O$ is a cubic structure and has a 2θ value of approximately 36.78°. Accordingly, when CuO is used, a plurality of polycrystals having a crystal structure of [002] and [200] planes exist in the semiconductor oxide electrolyte layer, and when $Cu_2O$ is used, a plurality of polycrystals having a crystal structure of a [111] plane exist in the semiconductor oxide electrolyte layer. In addition, when both CuO and $Cu_2O$ are used, a plurality of polycrystals having a crystal structure of [002], [200] and [111] planes exist in the semiconductor oxide electrolyte layer.

Figure 3:
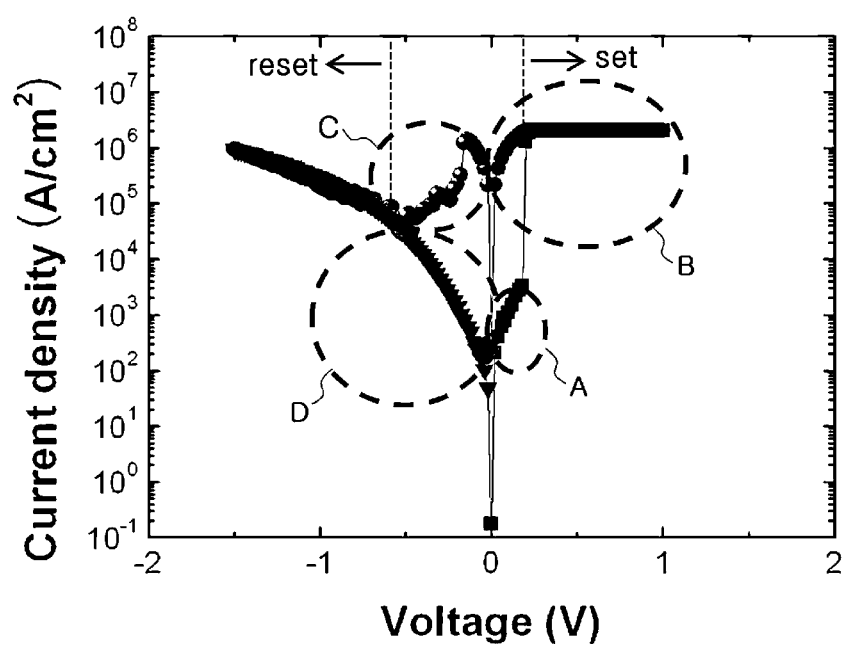
FIG. 3 is a voltage-current characteristic graph of a memory device in accordance with an exemplary embodiment.
Figure 4A:
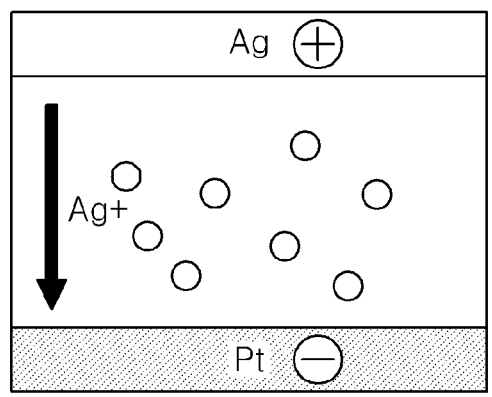
FIGS. 4A to 4D are schematic diagrams for explaining behaviors inside a semiconductor oxide electrolyte layer in accordance with voltage application.
Figure 4B:
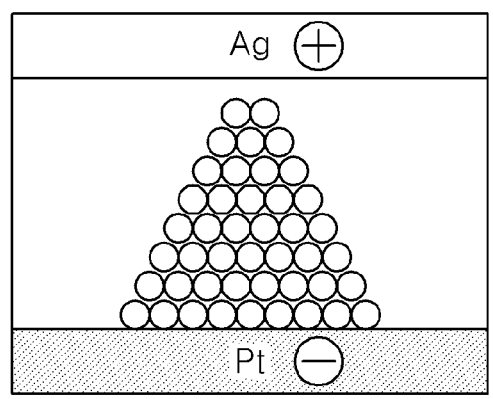
Figure 4C:
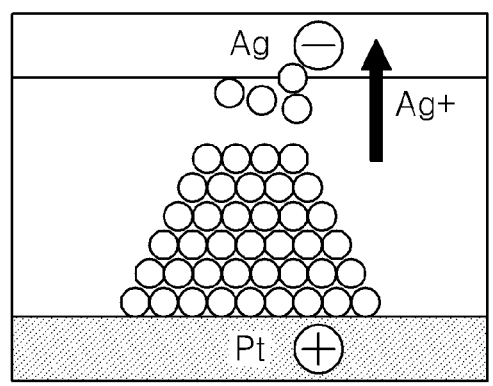
Figure 4D:
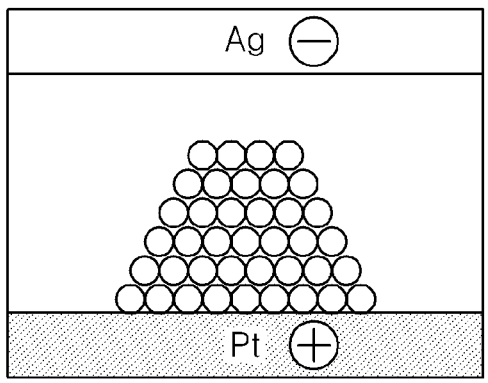

FIGS. 3 to 4D are views for explaining driving of a memory device according to an exemplary embodiment. FIG. 3 is a voltage-current characteristic graph when Cu2O is used for a semiconductor oxide electrolyte layer, and FIG. 4 is schematic diagrams for explaining behaviors in a semiconductor oxide electrolyte layer according to voltage application.

Referring to FIGS. 3 and 4A, in an initial state, when a positive voltage is applied to the second electrode 400 and a negative voltage is applied to the first electrode 200, cations move from the second electrode 400 to the semiconductor oxide electrolyte layer 300. The cations move along the metal vacancies of the semiconductor oxide electrolyte layer 300 and are reduced to the metal vacancies. In this way, as the positive voltage applied to the second electrode 400 is increased, a current density is gradually increased (A).

Referring to FIGS. 3 and 4B, when the positive voltage applied to the second electrode 400 is equal to or greater than a predetermined value, the current density is rapidly increased (B). For example, when a voltage of approximately 0.3 V or greater is applied to the second electrode 400, the current density is rapidly increased, and even when the current density is increased to approximately 2 $MA/cm^2$, stable characteristics are shown. This is because as illustrated in FIG. 4B, cations moving from the second electrode 400 form the bridge 310 in the semiconductor oxide electrolyte layer 300 and the first and second electrodes 200 and 400 are connected through the bridge 310. A state where the current density is rapidly increased at a predetermined voltage in this way is a low resistance state of the memory device, namely, a set state and a voltage at this point is a set voltage $V_{set}$. Accordingly, the set voltage at this point is approximately 0.3 V or greater.

Referring to FIGS. 3 and 4C, after the bridge 310 is formed inside the semiconductor oxide electrolyte layer 300 and the low resistance state is maintained, when a negative voltage is applied to the second electrode 400 and a positive voltage is applied to the first electrode 200, the cations in the semiconductor oxide electrolyte layer 300 move towards the second electrode 400. At this point, the current density is gradually decreased from the set state (C). This is because a part of the bridge 310 is cut and accordingly resistance is gradually increased.

Referring to FIGS. 3 and 4D, when the negative voltage applied to the second electrode 400 is equal to or smaller than a predetermined value, the current density is rapidly decreased (D). For example, when a negative voltage of approximately -0.5 V or smaller is applied to the second electrode 400, the current density is rapidly decreased. This is because a part of the bridge 400 at a side of the second electrode 400 is cut in the semiconductor oxide electrolyte layer 300. A state where the current density is rapidly decreased at a predetermined negative voltage in this way is a high resistance state of the memory device, namely, a reset state and a voltage at this point is a reset voltage $V_{reset}$. Accordingly, the reset voltage at this point is approximately -0.5V or smaller.

As described above, a memory device in accordance with an exemplary embodiment includes the semiconductor oxide electrolyte layer 300 having a plurality of metal vacancies between the first and second electrodes 200 and 400 separately formed on the substrate 100. When a positive voltage is applied the second electrode 400 of this memory device, cations move along the metal vacancies of the semiconductor oxide electrolyte layer 300 from the second electrode 400 and are reduced to the metal vacancies to form the metal bridge, and accordingly to make the memory device in the low resistance state. In addition, when a negative voltage is applied to the second electrode 400 of the memory device, metal cations in the semiconductor oxide electrolyte layer 300 move to the second electrode 400 and are reduced, and accordingly the metal bridge is cut to make the memory device in the high resistance state.

Figure 5:
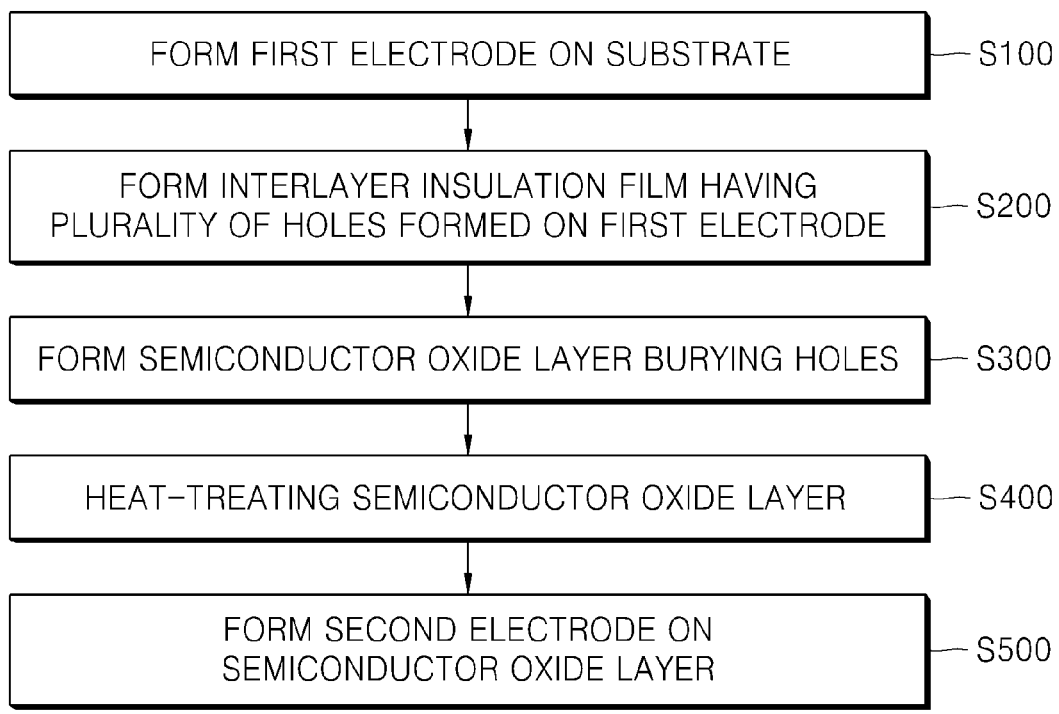
FIGS. 5 to 6E are a flowchart and cross-sectional views for explaining a manufacturing method of a memory device in accordance with an exemplary embodiment.
Figure 6A:
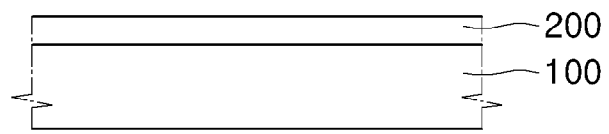
Figure 6B:
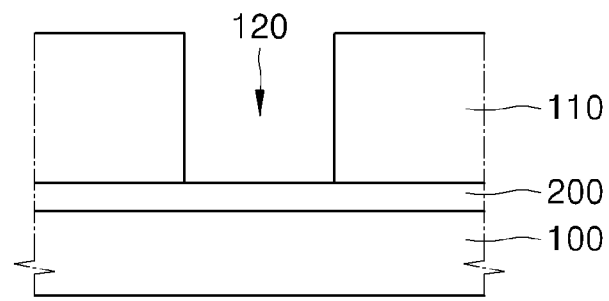
Figure 6C:
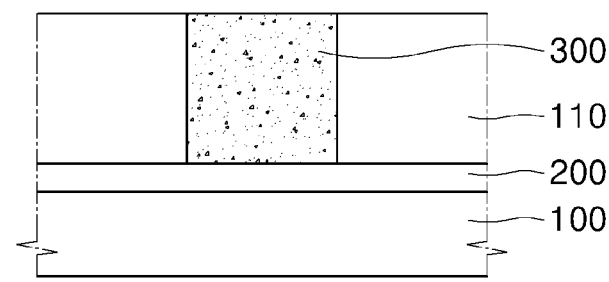
Figure 6D:
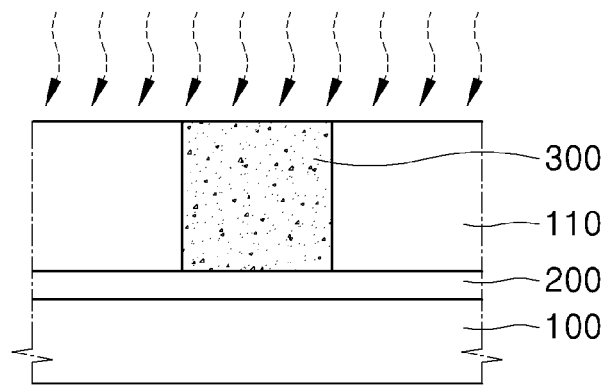

FIGS. 5 to 6D are a flowchart and cross-sectional views for explaining a manufacturing method of a memory device in accordance with an embodiment.

Referring to FIGS. 5 and 6A, the first electrode 200 is formed on the substrate (operation S100). However, before forming the first electrode 200, an insulation film (not illustrated) may be formed on the substrate 100 and a diffusion barrier (not illustrated) may be formed thereon. The insulation film may be formed with, for example, a silicon oxide film or a silicon nitride film, and the diffusion barrier may be formed with, for example, a TiN film. The first electrode 200 may be formed of a chemically inert conductive material, for example, at lease one selected from among platinum (Pt), ruthenium (Ru), titanium nitride (TiN), and a tantalum nitride (TaN). In present embodiment, platinum is used for the first electrode 200. The first electrode 200 may be formed in various methods, for example, a vapor deposition method. In addition, the first electrode 200 may be formed on a front surface of the substrate 100 and patterned in a type of a plurality of lines extended in one direction by a predetermined photo etching process.

Then, as illustrated in FIGS. 5 and 6B, after an interlayer insulation film 110 is formed on the top portion of the first electrode 200, a plurality of holes 120 are formed in the interlayer insulation film 110 (operation S200). The interlayer insulation 110 may be formed by using an insulation material such as silicon oxide or silicon nitride. In addition, the plurality of holes 120 may be formed by patterning a predetermined area of the interlayer insulation film 110 to expose the first electrode 200. After a photoresist film is formed on the interlayer insulation film 120 and the photoresist film is patterned through a photolithography process by using a predetermined mask, the plurality of holes 120 may be formed by using the patterned photoresist film 110 as an etching mask and etching the interlayer insulation layer 100. At this point, the plurality of holes 120 may be formed to have, for example, approximately 250 nm diameter and to have an interval equal to or greater than the diameter of the hole 120 between the holes 120.

At this point, as illustrated in FIGS. 5 and 6C, the semiconductor oxide electrolyte layer 300 is formed to bury the plurality of holes 120 (operation S300). The semiconductor oxide electrolyte layer 300 may be formed of, for example, at least any one of CuO and $Cu_2O$. In other words, each of CuO and $Cu_2O$ may be used, or CuO and $Cu_2O$ at a predetermined ratio may be used. This semiconductor oxide electrolyte layer 300 may be formed by using AC magnetic sputter equipment. At this point, a CuO target or $Cu_2O$ target may be used as a sputter target, and plasma generation power of 40 W or lower may be applied. For example, CuO may be formed by using the CuO target or formed in a state where $O_2$ is flowed in, and $Cu_2O$ may be formed by using $Cu_2O$ target.

In addition, a substrate holder supporting the substrate 100 may be rotated, for example, approximately 20 to 40 times per minute to form the semiconductor oxide electrolyte layer 300 having a uniform thickness. In this way, the semiconductor oxide electrolyte layer 300 may be formed in the thickness of approximately 10 nm to approximately 45 nm. For example, when CuO is used, the semiconductor oxide electrolyte layer 300 may be formed in the thickness of approximately 10 nm to approximately 45 nm, preferably, approximately 20 nm. In addition, when $Cu_2O$ is used, the semiconductor oxide electrolyte layer 300 may be formed in the thickness of approximately 25 nm to approximately 40 nm, preferably, approximately 30 nm to approximately 35 nm Of course, such process condition and thickness condition comply with an embodiment, and may be adjusted according to characteristics and size of the memory device. Furthermore, an argon gas is supplied into a chamber in which the substrate 100 is seated for generating plasma and an oxygen gas may be further supplied. The oxygen gas may be supplied to form CuO. At this point, oxygen may be supplied at a concentration of approximately 5% to approximately 10%, preferably, equal to or smaller than approximately 7.5% in comparison to argon. In other words, when argon is supplied at, for example, approximately 40 sccm, oxygen may be supplied at approximately 3 sccm. When a concentration of oxygen to argon in the chamber is equal to or greater than the above described range, the metal vacancies in CuO becomes much. Accordingly, multiple thick metal bridges are formed to degrade device stability. Furthermore, the semiconductor oxide electrolyte layer 300 may be formed by using a p-type semiconductor oxide including NiO, $Sn_xO$, and $Co_xO_y$ as well as CuO and Cu2O, and an n-type semiconductor oxide including $TiO_x$, ZnxO, $Al_xO_y$, and IGZO. In addition, at least two materials are mixed, for example, at least any one of $Cu_2O$ and NiO is mixed with CuO to form the semiconductor oxide electrolyte layer 300. In addition, the semiconductor oxide electrolyte layer 300 may be formed by using a chemical vapor deposition (CVD) as well as a sputter.

Then, as illustrated in FIGS. 5 and 6D, the substrate 100 on which the semiconductor oxide electrolyte layer 300 is formed is treated with heat (operation S400). The heat treatment process may be performed in an inert atmosphere such as a nitrogen atmosphere, and an amount of the metal vacancies in the semiconductor oxide electrolyte layer 300 may be adjusted by the heat treatment process. The heat treatment process may be performed at a temperature of approximately 350° C. to approximately 550° C. However, the heat treatment temperature may be varied according to a material of the semiconductor oxide electrolyte layer 300. In other words, for CuO, heat treatment may be performed at a temperature of approximately 350° C. to approximately 550° C., preferably, approximately 450° C. In addition, for $Cu_2O$, heat treatment may be performed at a temperature of a room temperature to approximately 265° C. For $Cu_2O$, in a case where the heat treatment temperature is too low, the amount of the metal vacancies becomes so much to have conductivity. In a case where the heat treatment temperature is too high, the amount of the metal vacancies becomes so little to have insulation. Accordingly, the temperature of heat treatment may be adjusted to allow CuO to have semiconductor characteristics and proper metal vacancies. In addition, for $Cu_2O$, when the heat treatment temperature is too high, $Cu_2O$ is transformed into CuO. Accordingly, the temperature of heat treatment may be adjusted to allow $Cu_2O$ to have proper metal vacancies without being transformed into CuO. Metal bridge formation conditions, namely, the set and reset voltages may be adjusted and the current density may be adjusted by adjusting the metal vacancies in the semiconductor oxide electrolyte layer 300 by this heat treatment process.

Figure 6E:
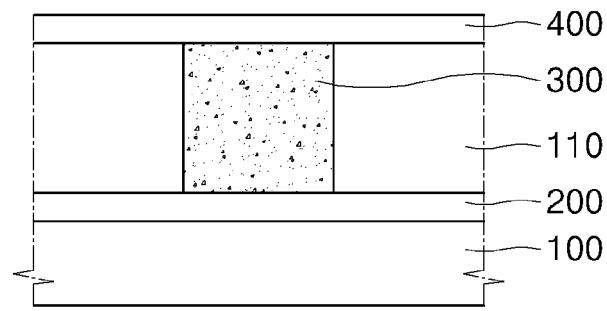

Then, as illustrated in FIGS. 5 and 6E, the second electrode 400 is formed on the semiconductor oxide electrolyte layer 300. The second electrode 400 may be formed of a conductive material generating metal ions such as copper (Cu) or silver (Ag). In the present embodiment, silver is used for the second electrode 400. The first electrode 400 may be formed in various methods, for example, a vapor deposition method. In addition, the second electrode 400 may be formed only on the semiconductor oxide electrolyte layer 300 and patterned in a type of a plurality of lines extended in another direction perpendicular to the first electrode 200 by a predetermined photo and etching process.

Characteristics of CuO

When CuO is used for the p-type semiconductor oxide electrolyte layer, characteristics of CuO according to a formation condition are as follows.

Figure 7:
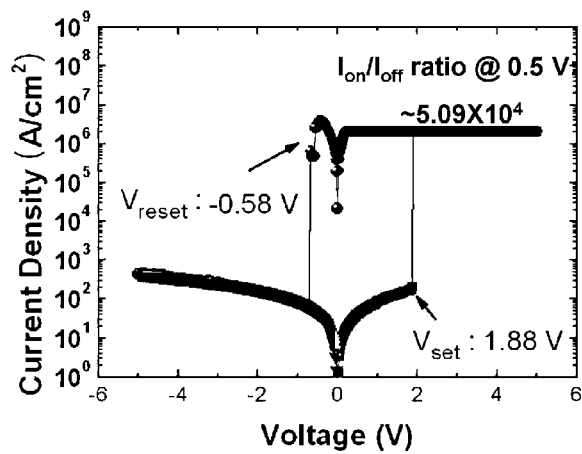
FIGS. 7 to 9 are characteristic graphs of a memory device in which CuO is used as a semiconductor oxide electrolyte layer in accordance with an exemplary embodiment.
Figure 8:
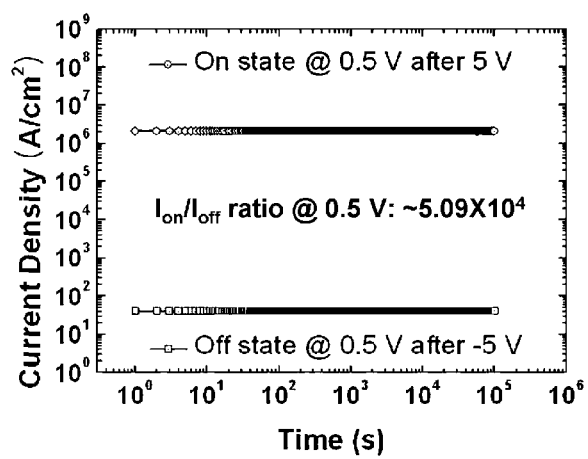
Figure 9:
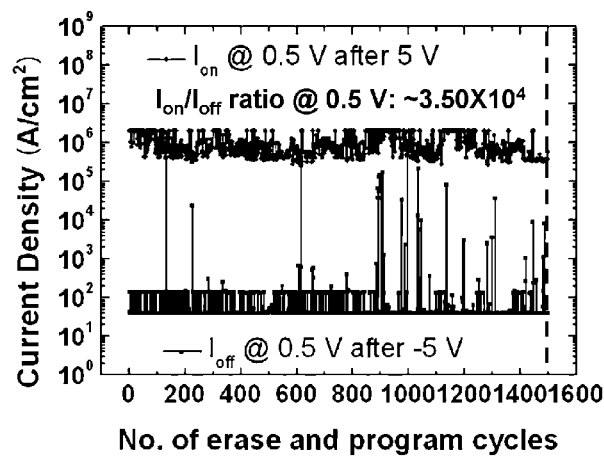
Figure 10:
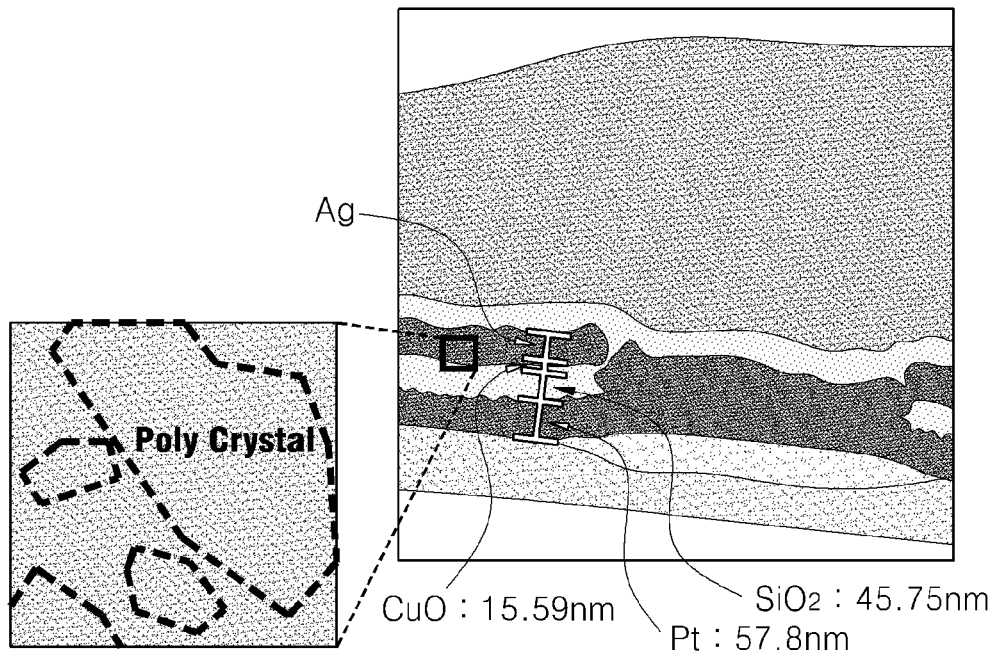
FIG. 10 is a TEM photo of a memory device in which CuO is used as a semiconductor oxide electrolyte layer in accordance with an embodiment.

FIGS. 7 to 9 are characteristic graphs of CuO used for the p-type semiconductor oxide electrolyte layer of an exemplary embodiment. In other words, FIG. 7 is a voltage-current characteristic graph, FIG. 8 is a data retention characteristic graph, and FIG. 9 is a endurance characteristic graph according to the set and reset number of times. At this point, the first electrode was formed of platinum, the p-type semiconductor oxide electrolyte layer on a top portion thereof was formed of CuO with a thickness of 20 nm, and the second electrode was formed of silver on a top portion thereof. In addition, CuO was formed in an AC magnetic sputter method by using a $Cu_2O$ target and supplying argon of 50 sccm and oxygen of 3 sccm, and was heat-treated at a temperature of 450° C. for 30 minutes. A TEM photo of a memory device formed in this way is shown in FIG. 10.

Firstly, from the voltage-current characteristic graph of FIG. 7, the set voltage at which the current density is rapidly increased and stabilized is approximately 1.88 V and the rest voltage at which the current density is rapidly decreased and stabilized is approximately −0.58 V. In other words, the memory device may be set at a voltage of approximately 1.88 V or greater, and may be reset at a voltage of approximately −0.58 V or smaller. In addition, a ratio ($I_{on}/I_{off}$) of an on current ($I_{on}$) when a read voltage of approximately 0.5 V is applied, after the memory device is set and an off current ($I_{off}$) when a read voltage of approximately 0.5 V is applied, after the memory is reset, is approximately $5.09 \times 10^4$. In addition, a data retention characteristic graph of FIG. 8 shows a change of the on current Ion over time in a case where a read voltage of approximately 0.5 V is applied after the set voltage of approximately 5V is applied and a change of the off current Ioff over time in a case where a read voltage of approximately 0.5 V is applied after the reset voltage of approximately −5V is applied. As illustrated, it may be seen that the on and off currents are retained without change even when a time passes. From this, it may be seen that the set and reset states may be stably maintained when CuO is used for the p-type semiconductor oxide electrolyte layer. In addition, as known from an endurance characteristic graph of FIG. 9, the program and erase number of times, namely, the set and reset repetition number of times is approximately 1500. Furthermore, as illustrated in FIG. 10, it may be seen that CuO is formed in a structure having a plurality of polycrystals between Pt and Ag. In a case where CuO is used for the p-type semiconductor oxide electrolyte layer in this way, the current density of the memory device is approximately 2 $MA/cm^2$.

Figure 11A:
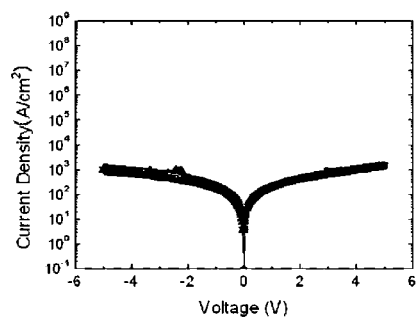
FIGS. 11A to 13D are characteristic graphs of a memory device according to an oxygen supply amount in which CuO is used as a semiconductor oxide electrolyte layer in accordance with an exemplary embodiment and also include characteristic graphs according to the thickness of a memory device in which CuO is used as a semiconductor oxide electrolyte layer in accordance with an exemplary embodiment.
Figure 11B:
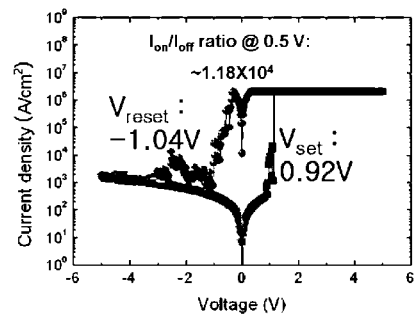
Figure 11C:
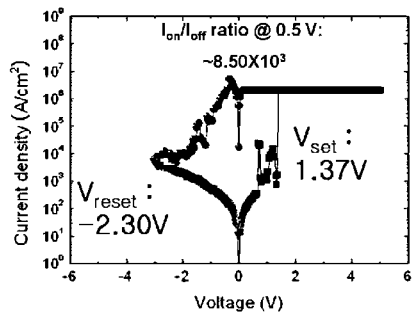
Figure 11D:
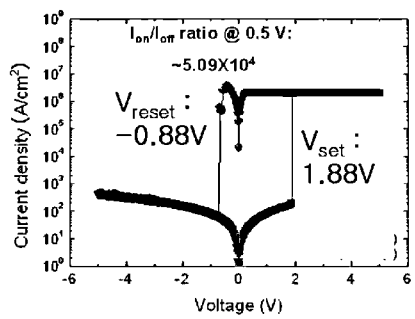
Figure 11E:
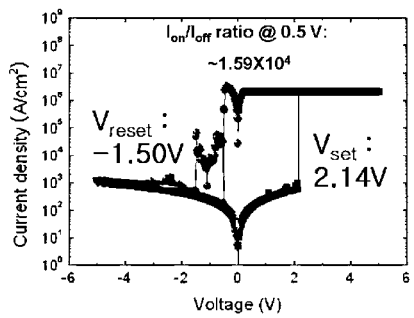
Figure 11F:
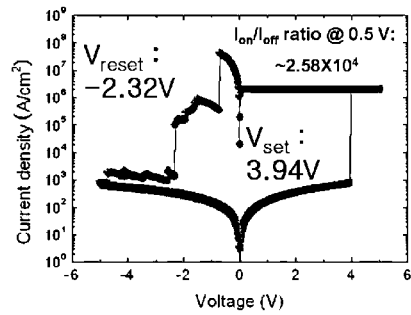
Figure 12A:
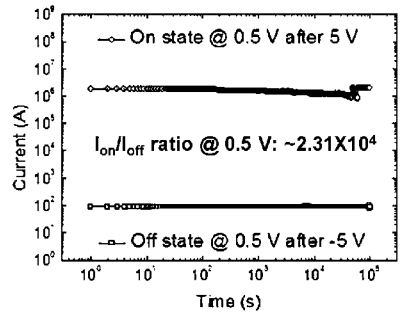
Figure 12B:
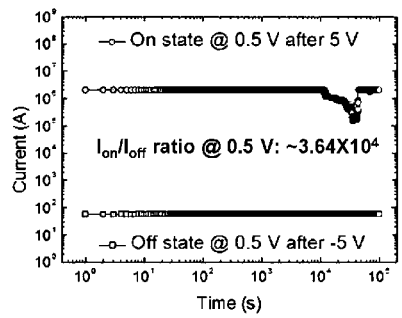
Figure 12C:
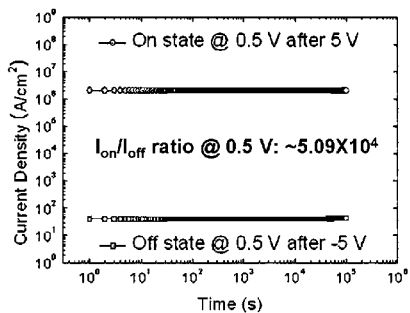
Figure 12D:
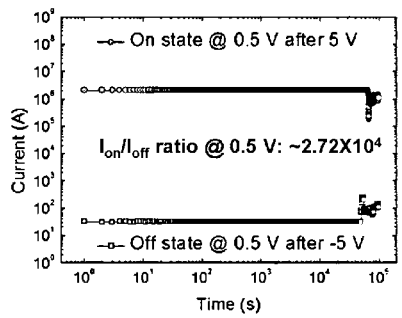
Figure 13A:
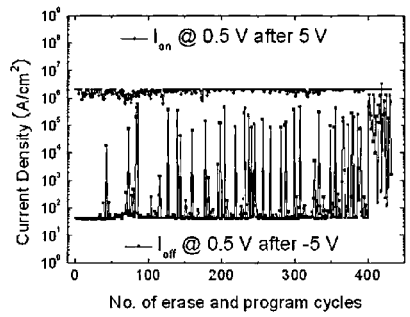
Figure 13B:
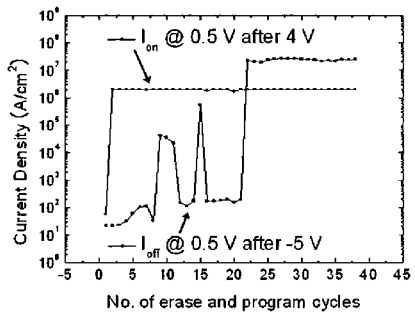
Figure 13C:
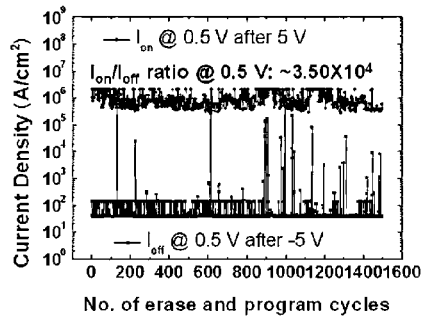
Figure 13D:
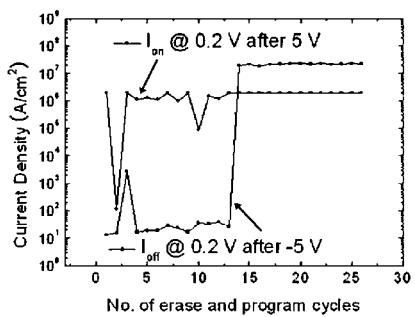

FIG. 11A to FIG. 13D are characteristic graphs according to an oxygen supply amount of a memory device in which CuO is used for a p-type semiconductor oxide electrolyte layer. In other words, FIGS. 11A to 11F are voltage-current characteristic graphs, FIGS. 12A to 12D are data retention characteristic graphs, and FIGS. 13A to 13D are endurance characteristic graphs. In addition, FIG. 11A is for a case where oxygen is not supplied, FIG. 11B is for a case where oxygen of 1 sccm is supplied, FIG. 11C is for a case where oxygen of 2 sccm is supplied, FIG. 11D is for a case where oxygen of 3 sccm is supplied, FIG. 11E is for a case where oxygen of 5 sccm is supplied, and FIG. 11F is for a case where oxygen of 10 sccm is supplied. However, when oxygen is not supplied or oxygen of 10 sccm is supplied, characteristics do not appear. FIGS. 12A and 13A are for a case where oxygen of 1 sccm is supplied, FIGS. 12B and 13B are for a case where oxygen of 2 sccm is supplied, FIGS. 12C and 13C are for a case where oxygen of 3 sccm is supplied, and FIGS. 12D and 13D are for a case where oxygen of 5 sccm is supplied. At this point, CuO was formed to have the thickness of approximately 20 nm, and heat-treated at approximately 450° C. for 30 minutes.

As illustrated in FIGS. 11A to 11F, when oxygen is not supplied, the current density is not sufficient. In addition, for a case where oxygen of 1 sccm is supplied, the set voltage is 0.924 V and the reset voltage is −1.04 V. In addition, for a case where oxygen of 2 sccm is supplied, the set voltage is 1.37V and the reset voltage is −2.30V. In addition, for a case where oxygen of 3 sccm is supplied, the set voltage is 1.88V and the reset voltage is −0.88V. In addition, for a case where oxygen of 5 sccm is supplied, the set voltage is 2.14V and the reset voltage is −1.50V. In addition, for a case where oxygen of 10 sccm is supplied, the set voltage is 3.94V and the reset voltage is −2.32V. As known from FIGS. 11A to 11F, during formation of CuO, as an oxygen supply amount is increased, the set voltage is increased.

As illustrated in FIGS. 12A to 12D, data retention characteristic is the best when the oxygen supply amount is 3 sccm. In other words, it may be seen that the on current Ion and off current Ioff are stably maintained. However, for rest cases, as a time passes, the on current Ion and off current Ioff are varied and it may be seen therefrom that data retention characteristic is not good. Furthermore, the on/off current ratio ($I_{on}/I_{off}$) is approximately $2.31 \times 10^4$ for A, approximately $3.64 \times 10^4$ for B, approximately $5.09 \times 10^4$ for C, and approximately $2.72 \times 10^4$ for D, and when oxygen of 3 sccm is supplied, the on/off current ratio becomes the largest.

As illustrated in FIGS. 13A to 13D, the endurance characteristic is the best when the oxygen supply amount is 3 sccm, and is unstable for the rest cases. In other words, when oxygen of 1 sccm is supplied, an endurance cycle is approximately 400 times and for 3 sccm, the endurance cycle becomes approximately 1600 times. However, when oxygen of 2 sccm and 5 sccm is supplied, the endurance characteristic does not appear.

As seen through FIG. 11A to FIG. 13D, during forming CuO, memory device characteristics may be adjusted according to the oxygen supply amount. When oxygen of 3 sccm is supplied, the most stable characteristics appear.

Figure 14A:
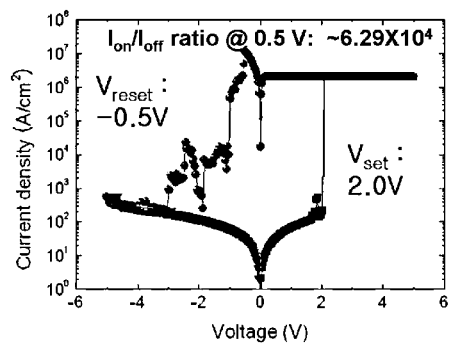
FIGS. 14A to 16C are characteristic graphs according to the thickness of a memory device in which CuO is used as a semiconductor oxide electrolyte layer in accordance with an exemplary embodiment.
Figure 14B:
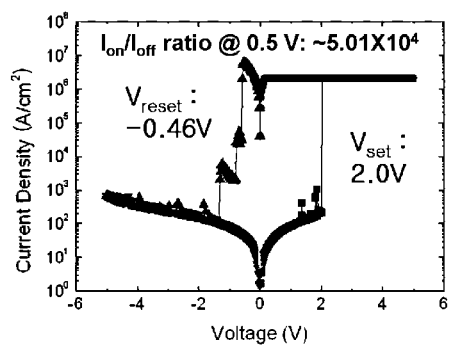
Figure 14C:
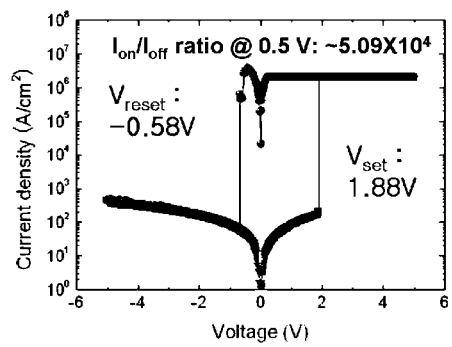
Figure 15A:
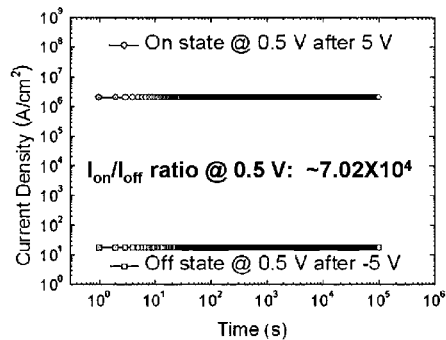
Figure 15B:
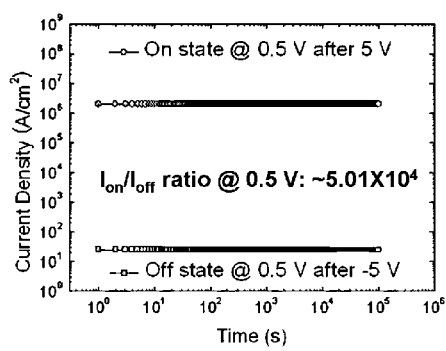
Figure 15C:
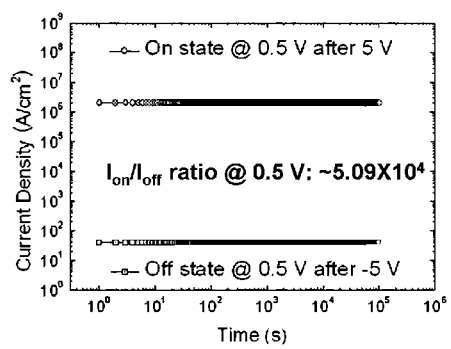
Figure 16A:
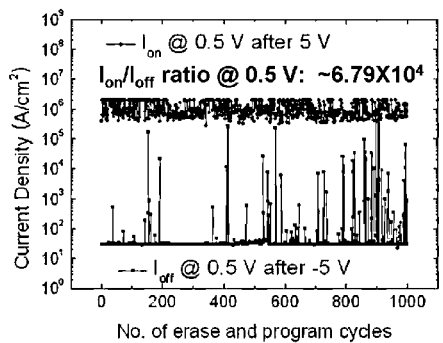
Figure 16B:
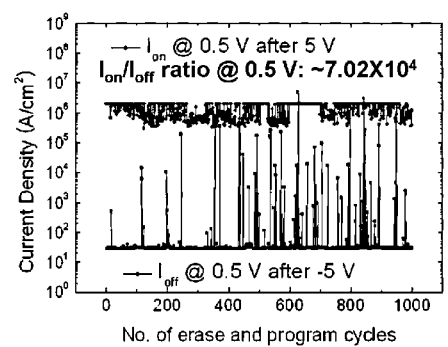
Figure 16C:
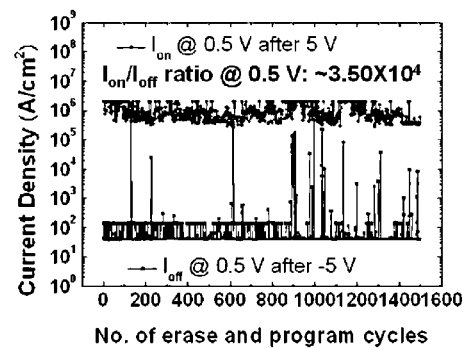

FIGS. 14A to 16C are characteristic graphs according to the thickness of a memory device in which CuO is used for a p-type semiconductor oxide electrolyte layer. In other words, FIGS. 14A to 14C are voltage-current characteristic graphs, FIGS. 13A to 13C are data retention characteristic graphs, and FIGS. 16A to 13C are endurance characteristic graphs. Here, FIGS. 14A, 15A and 16A are for a case where CuO is formed to have the thickness of 10 nm, FIGS. 14B, 15B and 16B are for a case where CuO is formed to have the thickness of 15 nm, and FIGS. 14C, 15C and 16C are for a case where CuO is formed to have the thickness of 20 nm.

At this point, CuO is formed by supplying oxygen of 3 sccm, and heat-treated at a temperature of 450° C. for 30 minutes.

As illustrated in FIGS. 14A to 14C, when CuO is formed to have the thickness of 10 nm, the set voltage is 2.0 V and the reset voltage is −0.5 V. In addition, when CuO is formed to have the thickness of 15 nm, the set voltage is 2.0 V and the reset voltage is −0.46 V. In addition, when CuO is formed to have the thickness of 20 nm, the set voltage is 1.88V and the reset voltage is −0.58 V. As known from FIGS. 14A to 14C, as the thickness of CuO is thicker, the set voltage gets lowered.

As illustrated in FIGS. 15A to 15C, the data retention characteristic appears stable for all thicknesses of CuO. However, when CuO is formed to have the thickness of 10 nm, the on/off current ratio ($I_{on}/I_{off}$) is approximately $7.02\times 10^4$, for the thickness of 10 nm, the on/off current ratio ($I_{on}/I_{off}$) is approximately $5.01\times 10^4$, and for the thickness of 20 nm, the on/off current ratio ($I_{on}/I_{off}$) is approximately $5.09\times 10^4$.

As illustrated in FIGS. 16A to 16C, the endurance characteristic is the best when the thickness of CuO is approximately 20 nm. In other words, when formed to have the thickness of 10 nm and 15 nm, the endurance characteristic may have approximately 1000 times, and for the thickness of 20 nm, the endurance characteristic may have approximately 1600 times.

As known from FIGS. 14A to 16C, when the thickness of CuO is 20 nm, the most stable characteristic appears.

Figure 17:
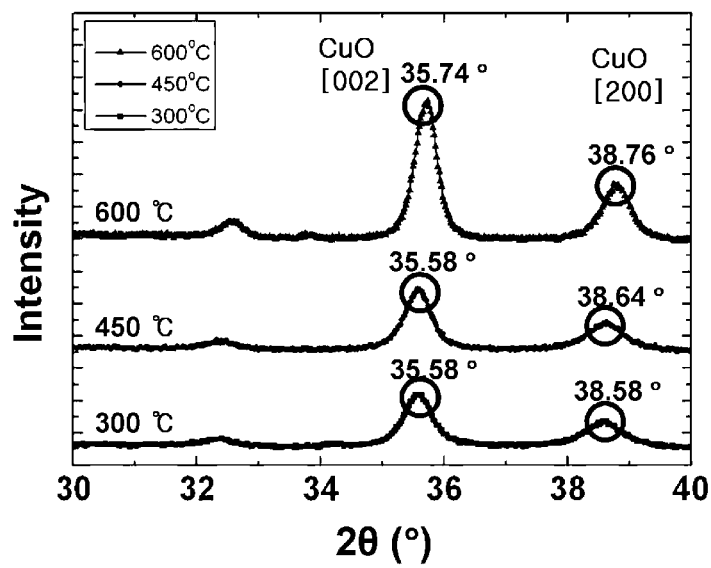
FIG. 17 is an XRD graph of CuO according to a heat treatment temperature.
Figure 18A:
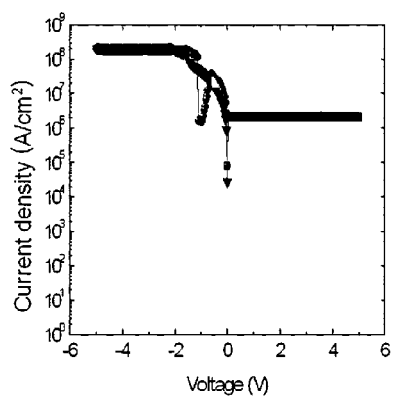
FIGS. 18A to 20C are characteristic graphs of CuO according to a heat treatment temperature.
Figure 18B:
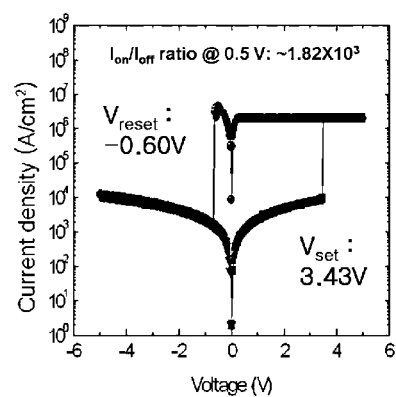
Figure 18C:
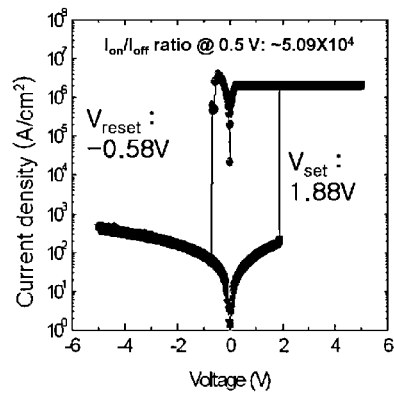
Figure 18D:
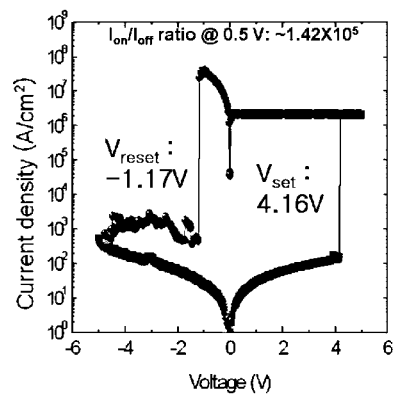
Figure 18E:
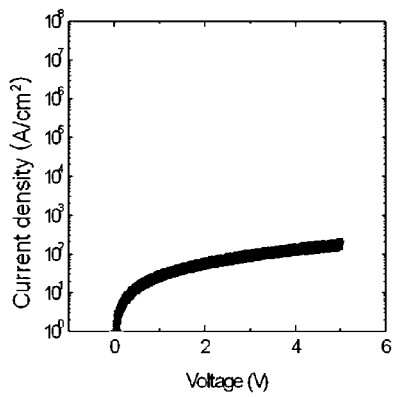
Figure 19A:
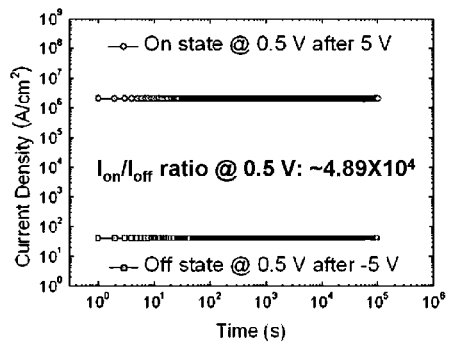
Figure 19B:
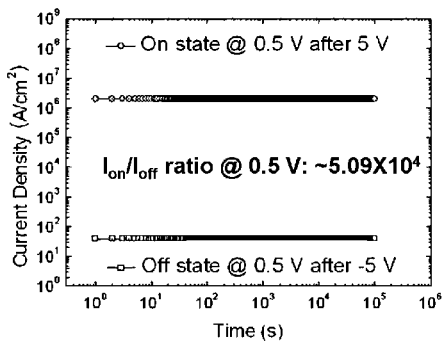
Figure 19C:
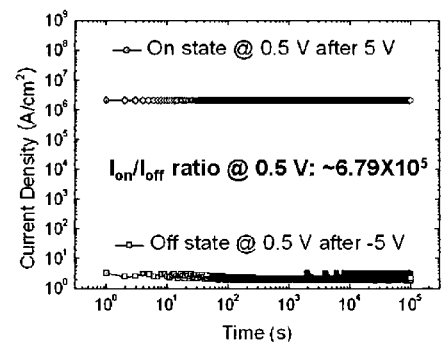
Figure 20A:
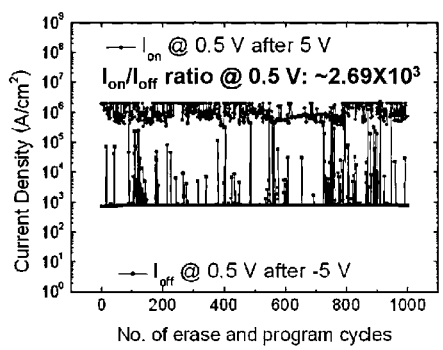
Figure 20B:
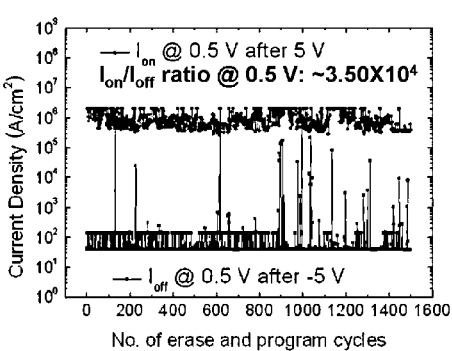
Figure 20C:
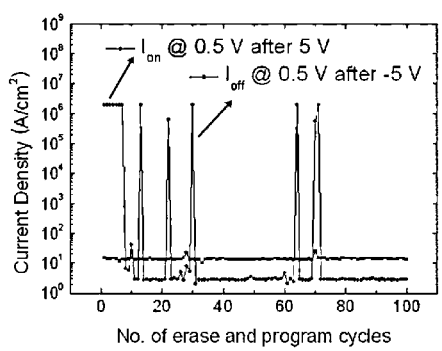

FIG. 17 is an XRD graph according to a heat treatment temperature, and FIGS. 18A to 20C are characteristic graphs according to a heat treatment temperature of CuO. In other words, FIGS. 18A to 18E are voltage-current characteristic graphs, FIGS. 19A to 19C are data retention characteristic graphs, and FIGS. 20A to 20C are endurance characteristic graphs of CuO according to the heat treatment temperature.

As illustrated in FIG. 17, when a heat treatment process is performed at a temperature of 300° C., CuO has 2θ values of 35.58° and 38.58° of [002] and [200] planes. When the heat treatment process is performed at a temperature of 400° C., CuO has 2θ values of 35.58° and 38.64° of [002] and [200] planes. When the heat treatment process is performed at a temperature of 500° C., CuO has 2θ values of 35.74° and 38.76° of [002] and [200] planes.

In addition, FIGS. 18A to 18E are voltage-current characteristic graphs when heat treatment is respectively performed at a temperature of 300° C., 375° C., 450° C., 525° C. and 600° C. As illustrated, at the heat treatment temperatures of 300° C. and 600° C., voltage characteristic does not appear. When heat treatment is performed at a temperature of 300° C., the metal vacancies are so much to have conductivity, and when heat treatment is performed at a temperature of 600° C., the metal vacancies are so little to have insulation. However, at the heat treatment temperature of 375° C., the set voltage is approximately 3.43V and the reset voltage is approximately −0.60V. At the heat treatment temperature of 450° C., the set voltage is approximately 1.88V and the reset voltage is approximately −0.58V. In addition, at the heat treatment temperature of 525° C., the set voltage is approximately 4.16V and the reset voltage is approximately −1.17V.

FIGS. 19A and 20A are data retention and endurance characteristic graphs at a heat treatment temperature of 375° C., FIGS. 19B and 20B are at a heat treatment temperature of 450° C., and FIGS. 19C and 20C are at a heat treatment temperature of 525° C. As illustrated in FIGS. 19A to 19C, the data retention characteristics are all excellent. However, as illustrated in FIGS. 20A to 20C, the endurance characteristic is the best at a heat treatment temperature of 450° C. In other words, at 375° C., the endurance characteristic has a cycle characteristic of 1000 times, and at 450° C., the endurance characteristic has a cycle characteristic of 1600 times. However, at 525° C., the cycle characteristic does not appear.

As known from FIGS. 18A to 20C, when CuO is treated at 450° C., the most stable characteristic appears.

Characteristics of $Cu_2O$

When $Cu_2O$ is used for the p-type semiconductor oxide electrolyte layer, characteristics of $Cu_2O$ according to a formation condition are described as follows.

Figure 21:
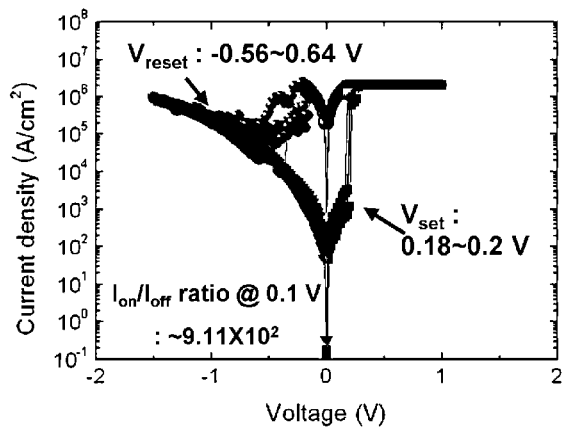
FIGS. 21 to 23 are characteristic graphs of a memory device in which Cu2O is used as a semiconductor oxide electrolyte layer in accordance with another exemplary embodiment.
Figure 22:
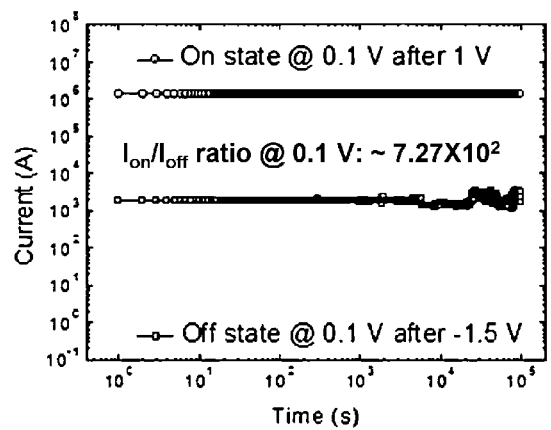
Figure 23:
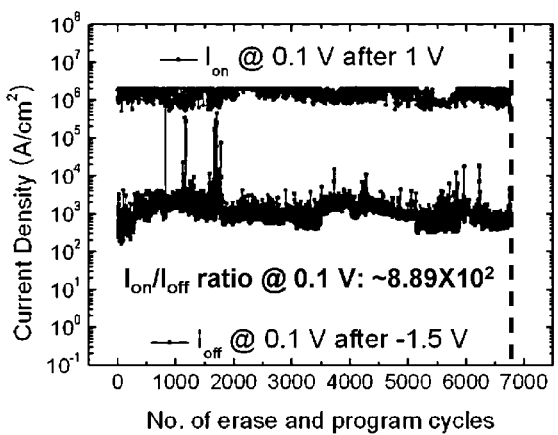

FIGS. 21 to 23 are characteristic graphs of $Cu_2O$ used for the p-type semiconductor oxide electrolyte layer of an exemplary embodiment. In other words, FIG. 21 is a voltage-current characteristic graph, FIG. 22 is a data retention characteristic graph, and FIG. 23 is an endurance characteristic graph. At this point, the first electrode was formed of platinum, the p-type semiconductor oxide electrolyte layer on a top portion thereof was formed of $Cu_2O$ with a thickness of approximately 30 nm, and the second electrode was formed of silver on a top portion thereof. In addition, $Cu_2O$ was formed in an AC magnetic sputter method by using a $Cu_2O$ target and supplying argon of approximately 50 sccm without oxygen supply, and was heat-treated at a temperature of approximately 250° C. for 30 minutes. A TEM photo of a memory device formed in this way is shown in FIG. 24.

Firstly, from the voltage-current characteristic graph of FIG. 21, the set voltage at which the current density is rapidly increased and stabilized is approximately 0.18V to approximately 0.2 V and the rest voltage at which the current density is rapidly decreased and stabilized is approximately −0.56 V to approximately −0.64 V. In addition, a ratio ($I_{on}/I_{off}$) of an on current ($I_{on}$) when a read voltage of approximately 0.1V is applied, after the memory device is set, and an off current ($I_{off}$) when a read voltage of approximately 0.1 V is applied, after the memory is reset, is approximately $9.11\times 10^2$. In addition, a data retention characteristic graph of FIG. 22 shows a change of the on current Ion over time in a case where a read voltage of approximately 0.1V is applied after the set voltage of approximately 1V is applied and a change of the off current $I_{off}$ over time in a case where a read voltage of approximately 0.1V is applied after the reset voltage of approximately −1.5V is applied. As illustrated, it may be seen that the on and off currents are retained without change even when a time passes. From this, it may be seen that the set and reset states may be stably maintained when $Cu_2O$ is used for the p-type semiconductor oxide electrolyte layer. In addition, the on and off currents have a large current difference, and the on/off current ratio ($I_{on}/I_{off}$) is approximately $7.27\times 10^2$. In addition, as known from an endurance characteristic graph of FIG. 23, the set and reset repetition number of times is approximately 6800.

Figure 24:
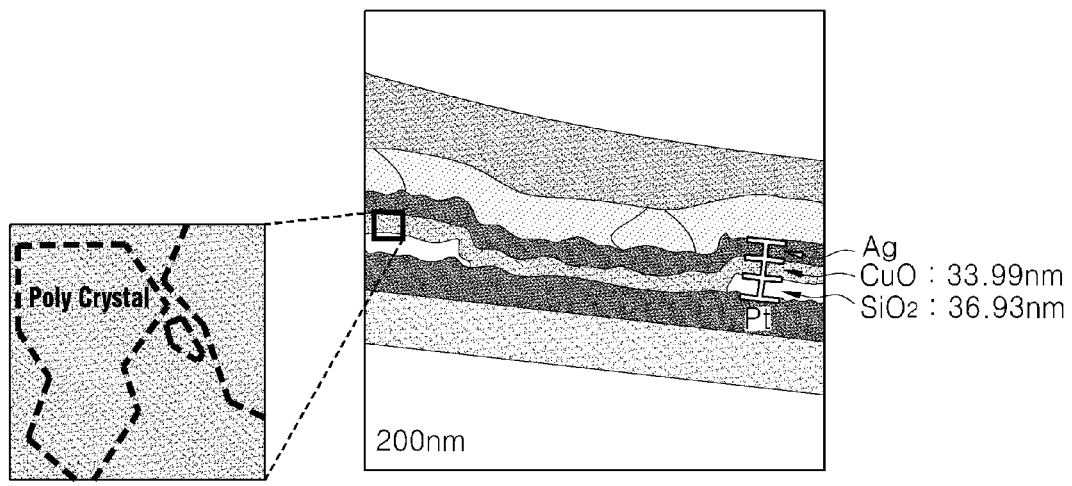
FIG. 24 is a TEM photo of a memory device in which $Cu_2O$ is used as a semiconductor oxide electrolyte layer in accordance with another embodiment.

Furthermore, as illustrated in FIG. 24, $Cu_2O$ is formed in a structure having a plurality of polycrystals between Pt and Ag. When $Cu_2O$ is used for the p-type semiconductor oxide electrolyte layer, the current density of the memory device is approximately 2 MA/cm².

Figure 25:
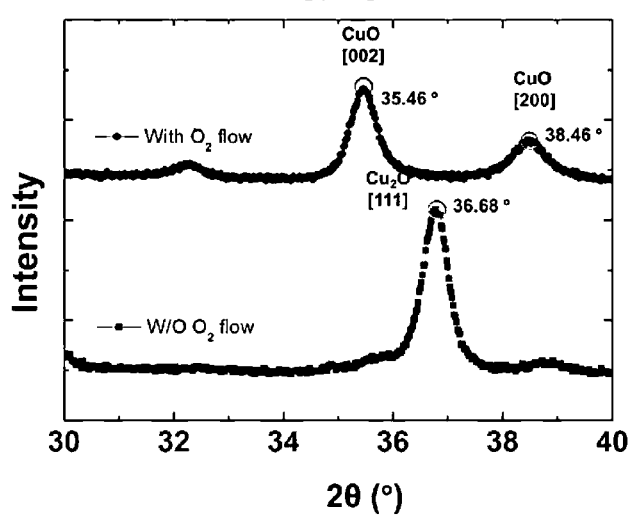
FIG. 25 is an XRD graph illustrating a characteristic change during deposition of $Cu_2O$ according to an oxygen supply amount.

FIG. 25 is an XRD graph illustrating a characteristic change according to an oxygen supply amount during deposition of $Cu_2O$. When deposited by using a $Cu_2O$ target, as illustrated, $Cu_2O$ is formed without supplying oxygen but CuO is formed when oxygen is supplied. In other words, when oxygen is not supplied, 2θ value of 36.68° of [111]

plane, but when oxygen is supplied, CuO is formed to 2θ values of 35.46° and 38.46° of [002] and [200] planes.

Figure 26:
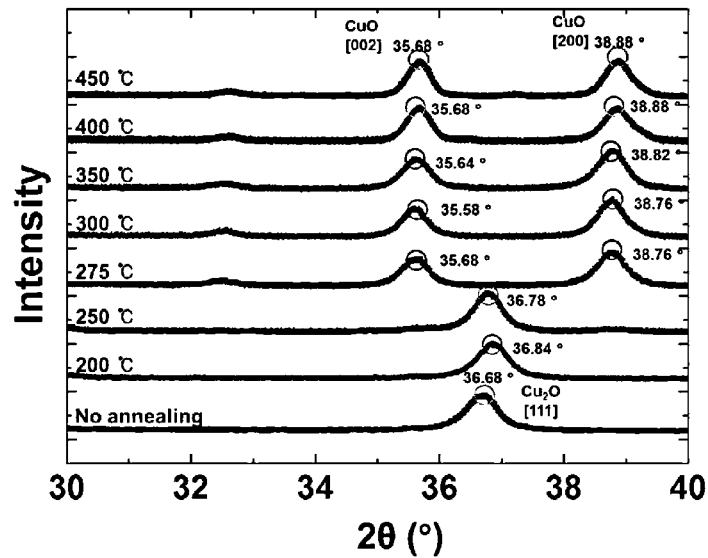
FIG. 26 is an XRD graph illustrating a characteristic change of $Cu_2O$ according a heat treatment temperature.

FIG. 26 is an XRD graph illustrating a characteristic change according a heat treatment temperature of $Cu_2O$. As illustrated, at a temperature of approximately 250° C. or lower, $Cu_2O$ is formed, but at a temperature of approximately 275° C. or higher, CuO is formed. In other words, without heat treatment, $Cu_2O$ is formed to have a 2θ value of 36.68° of [111] plane. For heat treatment at approximately 200° C., $Cu_2O$ is formed to have a 2θ value of 36.84° and for heat treatment at approximately 250° C., $Cu_2O$ is formed to have a 2θ value of 36.78°. However, for heat treatment at approximately 275° C., CuO is formed to have 2θ values of 35.48° and 38.76° of [002] and [200] planes. For heat treatment at approximately 300° C., CuO is formed to have 2θ values of 35.58° and 38.76°, and for heat treatment at approximately 350° C., CuO is formed to have 2θ values of 35.64° and 38.82°. In addition, for heat treatment at approximately 400° C., CuO is formed to have 2θ values of 35.68° and 38.88° and for heat treatment at approximately 450° C., CuO is formed to have 2θ values of 35.68° and 38.88°.

Figure 27A:
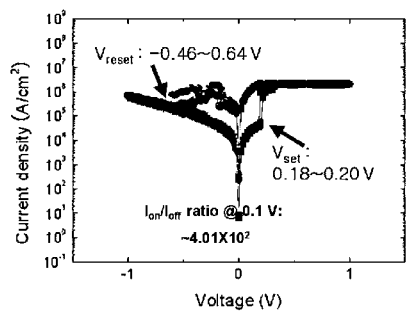
FIGS. 27A to 29E are characteristic graphs according to the thickness of a memory device in which $Cu_2O$ is used as a semiconductor oxide electrolyte layer in accordance with another exemplary embodiment.
Figure 27B:
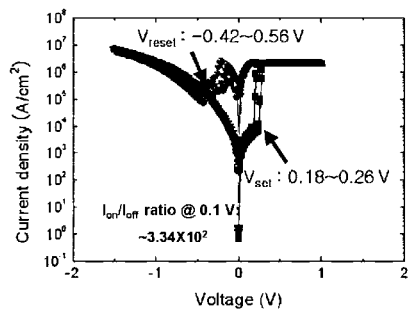
Figure 27C:
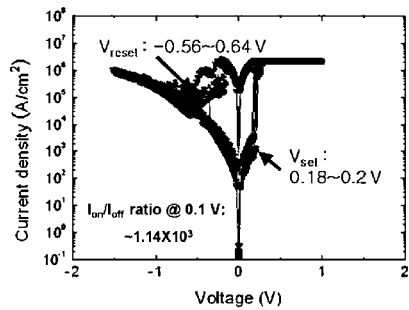
Figure 27D:
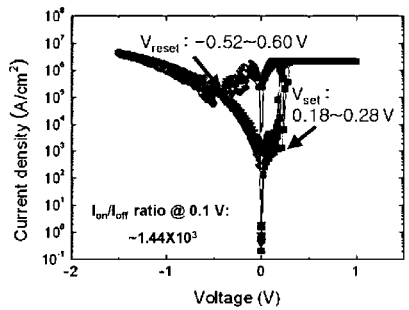
Figure 27E:
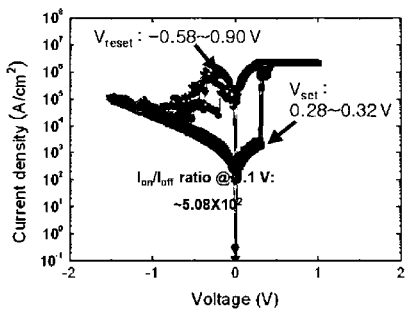
Figure 28A:
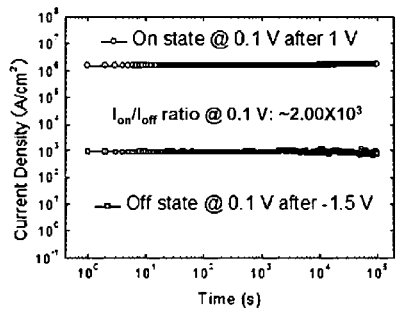
Figure 28B:
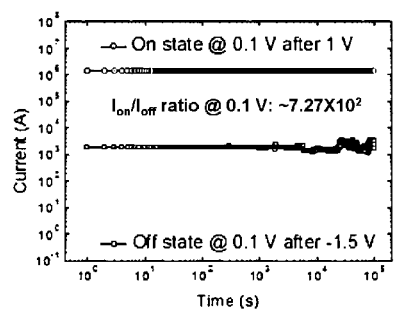
Figure 28C:
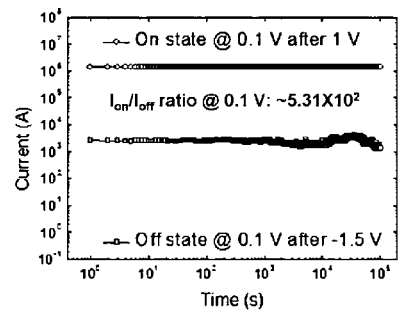
Figure 28D:
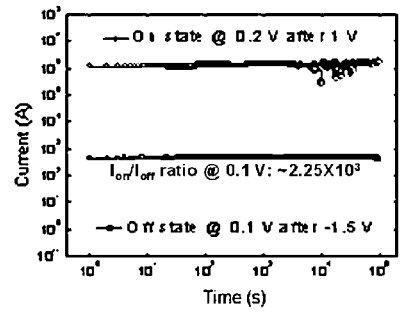
Figure 29A:
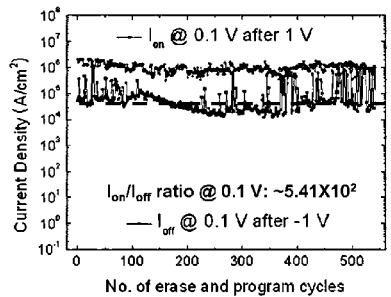
Figure 29B:
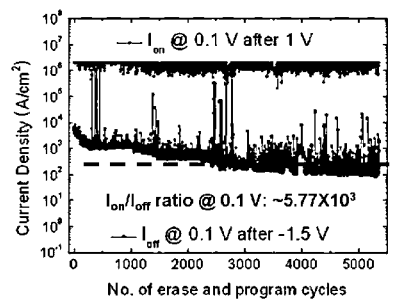
Figure 29C:
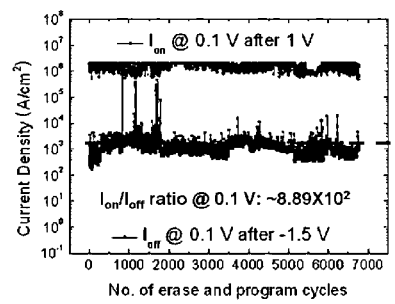
Figure 29D:
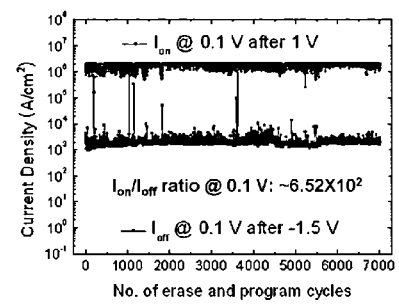
Figure 29E:
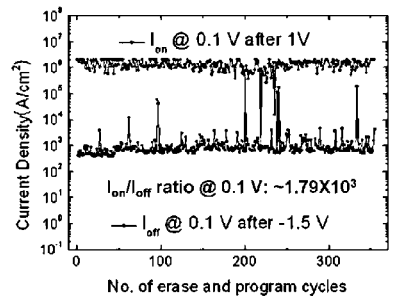

FIGS. 27A to 29 are characteristic graphs according to the thickness of a memory device in which $Cu_2O$ is used for a p-type semiconductor oxide electrolyte layer. In other words, FIGS. 27A to 27E are voltage-current characteristic graphs, FIG. 28A to 28D are data retention characteristic graphs, and FIGS. 29A to 29E are endurance characteristic graphs. Here, FIGS. 27A and 29E are for cases where $Cu_2O$ is formed to have the respective thicknesses of approximately 16.8 nm, 25 nm, 30 nm, 35 nm and 40 nm. In addition, since the endurance characteristic does not appear when $Cu_2O$ is formed to have the thickness of approximately 16.8 nm, FIGS. 27A to 27D are for cases where $Cu_2O$ is formed to have the respective thicknesses of approximately 25 nm, 30 nm, 35 nm, and 40 nm. At this point, CuO is formed without oxygen supply and heat-treated at a temperature of approximately 250° C. for 30 minutes.

As illustrated in FIGS. 27A to 27E, when $Cu_2O$ is formed to have the thickness of approximately 16.8 nm, the set voltage is approximately 0.18 V to approximately 0.2 V and the reset voltage is approximately −0.46 V to approximately −0.64 V. When $Cu_2O$ is formed to have the thickness of approximately 25 nm, the set voltage is approximately 0.18 V to approximately 0.26 V and the reset voltage is approximately −0.42 V to approximately −0.56 V. When $Cu_2O$ is formed to have the thickness of approximately 30 nm, the set voltage is approximately 0.18 V to approximately 0.2 V and the reset voltage is approximately −0.56 V to approximately −0.6 V. When $Cu_2O$ is formed to have the thickness of approximately 35 nm, the set voltage is approximately 0.18 V to approximately 0.28V and the reset voltage is approximately −0.52 V to approximately −0.6 V. When $Cu_2O$ is formed to have the thickness of approximately 40 nm, the set voltage is approximately 0.28 V to approximately 0.32 V and the reset voltage is approximately −0.58 V to approximately −0.9 V. As known from FIGS. 27A to 27E, as the thickness of $Cu_2O$ is thicker, the set voltage gets raised.

As illustrated in FIGS. 28A to 28D, the data retention characteristic appears stable for all thicknesses of $Cu_2O$. However, when $Cu_2O$ is formed to have the thickness of approximately 16.8 nm, the data retention characteristic does not appear.

As illustrated in FIGS. 29A to 29E, the endurance characteristic shows the best when the thickness of $Cu_2O$ is approximately 30 nm and 35 nm. In other words, when formed to have the thickness of approximately 16.8 nm and 40 nm, the endurance characteristic of 500 times, and for the thickness of approximately 25 nm, the endurance characteristic of 5000 times. When formed to have the thickness of approximately 30 nm and 35 nm, the endurance characteristic of 7000 times or more.

As known from FIGS. 27A to 29E, when the thickness of $Cu_2O$ is approximately 30 nm to approximately 40 nm, $Cu_2O$ has the most stable characteristic.

Comparison Between CuO and $Cu_2O$

In the foregoing, characteristics of CBRAM devices in which CuO and $Cu_2O$ are respectively used for a p-type semiconductor oxide electrolyte layer are described, and may be arranged as follows.

TABLE 1

| | CuO | $Cu_2O$ |
|---|---|---|
| oxygen supply | 3 sccm | 0 sccm |
| heat treatment temperature | 450° C. | 250° C. |
| thickness | 20 nm or smaller | 30~35 nm |
| on/off current ratio | $5.09 \times 10^4$ | $1.14 \times 10^3$ |
| current density | 2 $MA/cm^2$ | 2 $MA/cm^2$ |
| set voltage | Approximately 2.0 V | 0.2~0.3 V |
| reset voltage | −1~−2 V | −0.5~−1.5 V |
| endurance cycle | 1500 cycles | 7000 cycles |
| data retention time (room temperature) | $1 \times 10^5$ sec | $1 \times 10^5$ sec |
| HRS current density | Approximately $4 \times 10$ $A/cm^2$ | Approximately $2.8 \times 10^2$ $A/cm^2$ |

As described above, CuO has an optimal characteristic when formed with oxygen supply of approximately 3 sccm and with the thickness of approximately 20 nm, and heat-treated at a temperature of approximately 450° C. $Cu_2O$ has an optimal characteristic when formed without oxygen supply and with the thickness of approximately 30 nm to 35 nm, and heat-treated at a temperature of approximately 250° C. In other words, CuO is driven with the set voltage of approximately 2V and the reset voltage of approximately 1 to 2 V, and has an on/off current ratio of approximately $5.09 \times 10^4$, a current density of approximately 2 $MA/cm^2$, and data retention time of approximately $1 \times 10^5$ sec. In addition, $Cu_2O$ is driven with the set voltage of approximately 0.2 to 0.3V and the reset voltage of approximately 0.5 to 1.5V, and has an on/off current ratio of approximately $1.14 \times 10^3$, a current density of approximately 2 $MA/cm^2$, and data retention time of approximately $1 \times 10^5$ sec. Accordingly, CuO and $Cu_2O$ have almost similar characteristics. However, CuO has an endurance cycle of approximately 1500 times that is smaller than $Cu_2O$ having endurance cycle of 7000 times. Accordingly, it may be seen that $Cu_2O$ has more excellent characteristics than CuO.

Figure 30:
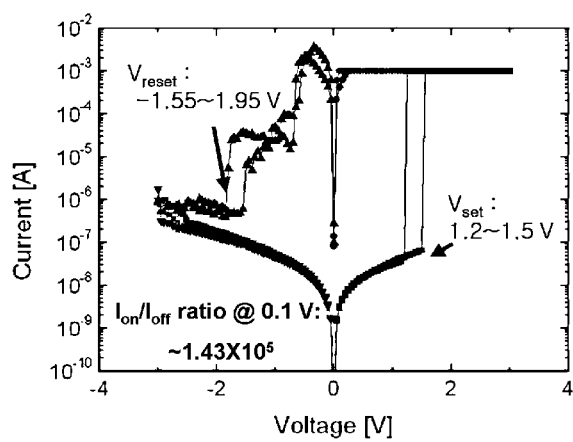
FIGS. 30 and 31 are characteristic graphs of $NiO_x$ and $TiO_x$ used as a semiconductor oxide electrolyte layer according to still another exemplary embodiment.
Figure 31:
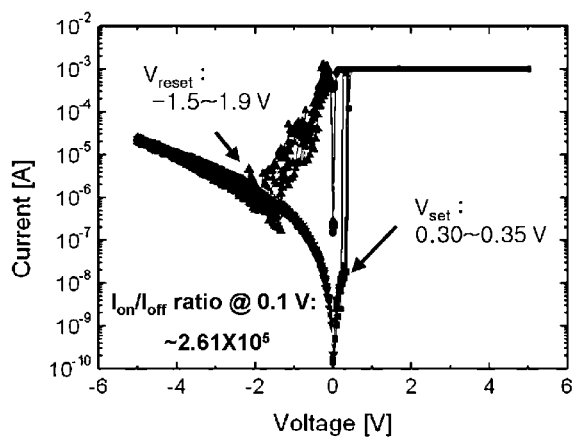

Furthermore, FIGS. 30 and 31 are voltage-current characteristic graphs of $NiO_x$ and $TiO_x$ used for semiconductor oxide electrolyte layer of an exemplary embodiment. From the voltage-current characteristic graph of $NiO_x$ of FIG. 30, the set voltage at which the current density is rapidly increased and stabilized is approximately 1.2 V to approximately 1.5 V and the rest voltage at which the current density is rapidly decreased and stabilized is approximately −0.1.55 V to approximately −1.95 V. In other words, the memory device may be set at a voltage of approximately 1.2 V or greater, and may be reset at a voltage of approximately −1.55 V or smaller. In addition, a ratio ($I_{on}/I_{off}$) of an on current ($I_{on}$) when a read voltage of approximately 0.1 V is applied, after the memory device is set, and an off current (IA when a read voltage of approximately of 0.1 V is applied, after the memory is reset, is approximately $1.43 \times 10^5$. In addition, from the voltage-current characteristic graph of TiO$_x$ of FIG. 31, the set voltage at which the current density is rapidly increased and stabilized is approximately 0.3 V to approximately 0.35 V and the rest voltage at which the current density is rapidly decreased and stabilized is approximately −1.5 V to approximately −1.9 V. In other words, the memory device may be set at a voltage of approximately 0.3 V or greater, and may be reset at a voltage of approximately −1.5 V or smaller. In addition, a ratio ($I_{on}/I_{off}$ of an on current ($I_{on}$) when a read voltage of approximately 0.1 V is applied, after the memory device is set, and an off current (IA when a read voltage of approximately of 0.1 V is applied, after the memory is reset, is approximately $2.61 \times 10^5$.

Figure 32A:
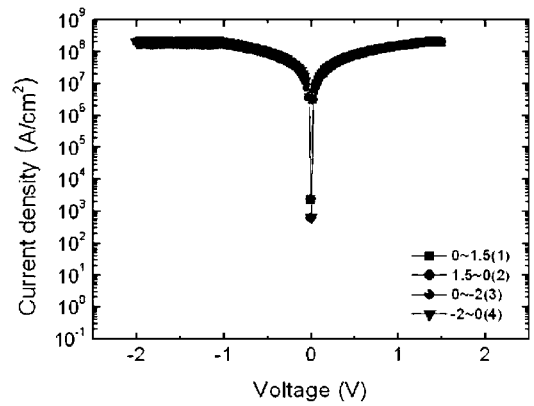
FIGS. 32A to 32C are voltage-current characteristic graphs according to a material change of a second electrode of a memory device in accordance with an exemplary embodiment.
Figure 32B:
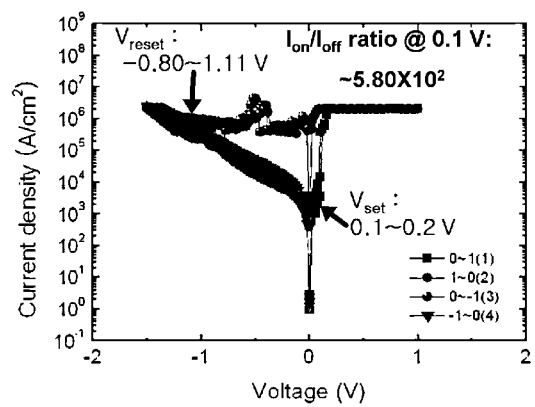
Figure 32C:
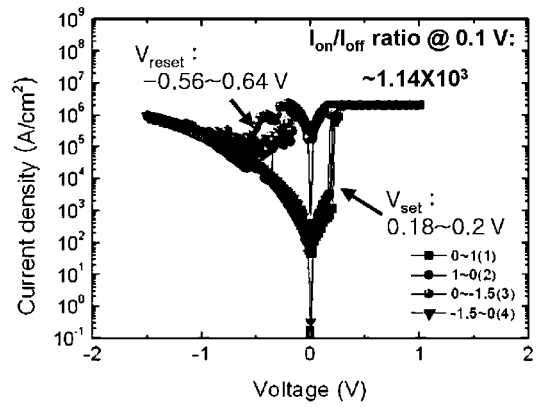

In addition, FIGS. 32A to 32C are voltage-current characteristic graphs according to a material of the second electrode. In other words, FIG. 32A is a case for using platinum (Pt) for the second electrode, FIG. 32B is a case for using copper (Cu) for the second electrode, and FIG. 32C is a case for using silver (Ag) for the second electrode. At this point, the first electrode is formed of platinum (Pt) and the p-type semiconductor oxide electrolyte layer is formed by forming Cu$_2$O to have the thickness of approximately 25 nm and heat-treating it at a temperature of approximately 250° C.

As illustrated in FIGS. 32A to 32C, when both the first and second electrodes are formed of platinum, a voltage is increased and applied, a current density is continuously increased and transition to a high resistance state does not occur, and accordingly the formed device does not operate as a memory device. In addition, when the second electrode is formed of copper, the set voltage is approximately 0.1 V to approximately 0.2 V, the reset voltage is approximately −0.8 V to approximately −1.11 V, and the on/off current ratio is approximately $5.8 \times 10^2$. In addition, when the second electrode is formed of silver, the set voltage is approximately 0.18 V to approximately 0.2 V, the reset voltage is approximately −0.56 V to approximately −0.64 V, and the on/off current ratio is approximately $1.14 \times 10^3$. Accordingly, when the second electrode is formed of silver, the current density if higher and the set voltage is lower than those of the case of using copper.

A memory device according to the embodiments includes a semiconductor oxide electrolyte layer having a plurality of metal vacancies between first and second electrodes separated from each other and when a positive voltage is applied to the second electrode, cations in the second electrode are reduced to the metal vacancies of the semiconductor oxide electrolyte layer to form a metal bridge. In addition, an amount and size of the metal vacancies can be adjusted according to the thickness of the semiconductor oxide electrolyte layer, a forming condition and a heat treatment condition after formation of the semiconductor oxide electrolyte layer, and accordingly a current density, set voltage, and reset voltage can be adjusted.

Accordingly, a memory device according to an embodiment can have a high current density of 2 MA/cm$^2$ or greater, and therefore can improve data retention time and endurance characteristics. In addition, memory device characteristics can be easily adjusted by adjusting process conditions.

Although the CBRAM memory device and a manufacturing method thereof have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A conductive bridging random access memory (CBRAM) device comprising:
   a first electrode;
   a semiconductor oxide electrolyte layer formed on the first electrode and comprising a plurality of metal vacancies; and
   a second electrode formed on the semiconductor oxide electrolyte layer,
   wherein the semiconductor oxide electrolyte layer is formed of a mixture of CuO, Cu$_2$O, and NiO, and is adjusted in at least one of an amount and size of the metal vacancies by adjusting a ratio of CuO, Cu$_2$O, and NiO.

2. The conductive bridging random access memory (CBRAM) device of claim 1, wherein the first electrode is formed of a material of which cations are not moved to the semiconductor oxide electrolyte layer even when a positive voltage is applied to the first electrode.

3. The conductive bridging random access memory (CBRAM) device of claim 2, wherein the second electrode is formed of a material of which cations are moved to the semiconductor oxide electrolyte layer when the positive voltage is applied to the second electrode.

4. The conductive bridging random access memory (CBRAM) device of claim 3, wherein cations are reduced to the metal vacancies of the semiconductor oxide electrolyte layer to form a metal bridge when the positive voltage is applied to the second electrode.

5. The conductive bridging random access memory (CBRAM) device of claim 1, wherein the semiconductor oxide electrolyte layer is formed to comprise a thickness of approximately 10 nm to approximately 45 nm.

6. The conductive bridging random access memory (CBRAM) device of claim 5, wherein CuO is formed to comprise a thickness of approximately 10 nm to approximately 45 nm, and Cu$_2$O is formed to comprise a thickness of approximately 25 nm to approximately 40 nm.

7. The conductive bridging random access memory (CBRAM) device of claim 1, wherein a current density is approximately 2 MA/cm$^2$ or greater, a set voltage is approximately 0.2 V to approximately 2 V, and a reset voltage is approximately −0.5 V to approximately 2 V.

8. A manufacturing method of a conductive bridging random access memory (CBRAM) device, the method comprising:
   forming a first electrode on a substrate;
   forming a semiconductor oxide electrolyte layer comprising a plurality of metal vacancies on the first electrode;
   heat-treating the semiconductor oxide electrolyte layer;
   forming a second electrode on the semiconductor oxide electrolyte layer; and
   wherein the semiconductor oxide electrolyte layer is formed of a mixture of CuO, Cu$_2$O and NiO, and is adjusted in at least one of an amount and size of the metal vacancies by adjusting a ratio of CuO, and Cu$_2$O, and NiO.

9. The method of claim 8, wherein at least any one of an amount and size of the metal vacancies is adjusted by adjusting a thickness, formation condition, and heat treatment condition of the semiconductor oxide electrolyte layer.

10. The method of claim 9, wherein CuO and Cu$_2$O are respectively formed in a sputter scheme using CuO and Cu$_2$O targets.

11. The method of claim 10, wherein CuO is formed by supplying oxygen and an inert gas.

12. The method of claim 11, wherein the oxygen is supplied at a concentration of approximately 5% to approximately 10% in comparison to the inert gas.

13. The method of claim 9, wherein the heat treatment is performed at a temperature of a room temperature to approximately 550° C. in an inert atmosphere.

14. The method of claim 13, wherein CuO is heat-treated at a temperature of approximately 350° C. to approximately 550° C., and $Cu_2O$ is heat-treated at a temperature of a room temperature to approximately 265° C.

15. The method of claim 14, wherein $Cu_2O$ is formed and then heat-treated at a temperature of approximately 270° C. to approximately 550° C. to be converted into CuO.

* * * * *